US010347318B2

(12) United States Patent
Kim et al.

(10) Patent No.: US 10,347,318 B2
(45) Date of Patent: Jul. 9, 2019

(54) SEMICONDUCTOR MEMORY DEVICE

(71) Applicant: SK hynix Inc., Gyeonggi-do (KR)

(72) Inventors: Jeong-Hwan Kim, Gyeonggi-do (KR); Jin-Ho Kim, Gyeonggi-do (KR); Sang-Hyun Sung, Chungcheongbuk-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/709,674

(22) Filed: Sep. 20, 2017

(65) Prior Publication Data

US 2018/0268892 A1 Sep. 20, 2018

(30) Foreign Application Priority Data

Mar. 20, 2017 (KR) ........................ 10-2017-0034421

(51) Int. Cl.

*G11C 5/06* (2006.01)
*G11C 11/408* (2006.01)
*G11C 8/14* (2006.01)
*G11C 8/08* (2006.01)
*G11C 8/10* (2006.01)
*G11C 16/04* (2006.01)
*H01L 27/11575* (2017.01)
*H01L 27/11582* (2017.01)
*G11C 5/02* (2006.01)
*G11C 7/18* (2006.01)
*H01L 27/11565* (2017.01)

(52) U.S. Cl.

CPC ............ *G11C 11/4087* (2013.01); *G11C 8/08* (2013.01); *G11C 8/10* (2013.01); *G11C 8/14* (2013.01); *G11C 16/0441* (2013.01); *H01L 27/11575* (2013.01); *H01L 27/11582* (2013.01); *G11C 5/025* (2013.01); *G11C 7/18* (2013.01); *H01L 27/11565* (2013.01)

(58) Field of Classification Search

CPC ......... G11C 11/4087; G11C 8/08; G11C 8/10; G11C 8/14; G11C 16/0441; H01L 27/11575; H01L 27/11582

USPC ................................ 365/230.06, 63, 189.08

See application file for complete search history.

(56) References Cited

U.S. PATENT DOCUMENTS 5,903,022 A * 5/1999 Takashima .............. G11C 8/14 257/296
5,933,387 A * 8/1999 Worley .................... G11C 8/14 365/189.08

(Continued)

FOREIGN PATENT DOCUMENTS

KR 100935734 1/2010
KR 101120176 2/2012

*Primary Examiner* — Viet Q Nguyen
(74) *Attorney, Agent, or Firm* — IP & T Group LLP

(57) ABSTRACT

A semiconductor memory device includes a memory cell array and a row decoder disposed in a first direction over a substrate and a plurality of coupling lines for electrically coupling the memory cell array and the row decoder. Each of the coupling lines includes a first conductive line disposed in the first direction; a second conductive line disposed parallel to the first conductive line; and a pad coupling the first conductive line and the second conductive line, and coupled to the memory cell array or the row decoder through a contact plug. The coupling lines are routed from both sides of the pad in the first direction.

18 Claims, 19 Drawing Sheets

L1 L1 L1 L1 PS PAD
LWLk-2 LWLk-1 LWLk LWLk+1 LWLk+2
1F
PAD PAD PAD L2 L2 L2 L2
SD VD FD

(56) References Cited

U.S. PATENT DOCUMENTS

| | | | | |
|---|---|---|---|---|
| 7,646,664 | B2 * | 1/2010 | Cho | G11C 8/08 365/214 |
| 8,860,117 | B2 * | 10/2014 | Tanzawa | H01L 27/11524 257/314 |
| 2006/0221758 | A1 * | 10/2006 | Petti | G11C 5/02 365/230.06 |
| 2007/0297232 | A1 * | 12/2007 | Iwata | G11C 8/10 365/185.17 |
| 2012/0140586 | A1 * | 6/2012 | Kim | G11C 5/02 365/230.03 |
| 2013/0044531 | A1 * | 2/2013 | Baek | G11C 5/025 365/72 |
| 2014/0064012 | A1 * | 3/2014 | Shin | G11C 8/12 365/230.03 |
| 2015/0077296 | A1 * | 3/2015 | An | H01P 11/00 343/720 |
| 2015/0364196 | A1 * | 12/2015 | Lin | G11C 16/08 365/185.11 |

* cited by examiner

BLK1
WLC
BLK2
1B
SR2
SR1
20
SSL
WL1
WL2
WL3
WL4
DSL
1A
BL
A
30
SLC
SD
FD
VD

SEMICONDUCTOR MEMORY DEVICE

CROSS-REFERENCE TO RELATED APPLICATION

The present application claims priority to Korean Patent Application No. 10-2017-0034421 filed in the Korean Intellectual Property Office on Mar. 20, 2017, which is incorporated herein by reference in its entirety.

BACKGROUND

1. Technical Field

Various embodiments generally relate to a semiconductor memory device.

2. Related Art

A semiconductor memory device continuously trends toward high integration, high capacity and miniaturization. In particular, various efforts have been attempted to realize a semiconductor memory device of a high capacity in a smaller size.

SUMMARY

In an embodiment, a semiconductor memory device may include: a memory cell array and a row decoder disposed in a first direction over a substrate; and a plurality of coupling lines for electrically coupling the memory cell array and the row decoder. Each of the coupling lines may include a first conductive line disposed in the first direction; a second conductive line disposed parallel to the first conductive line; and a pad coupling the first conductive line and the second conductive line, and coupled to the memory cell array or the row decoder through a contact plug. The coupling lines may be routed from both sides of the respective pads in the first direction.

In an embodiment, a semiconductor memory device may include: a first sub memory cell array and a second sub memory cell array disposed adjacent to each other in a first direction; a first sub row decoder disposed between the first sub memory cell array and the second sub memory cell array; and coupling lines disposed over the first and second sub memory cell arrays and the first sub row decoder. Each of the coupling lines may include a first conductive line which is disposed in the first direction, a second conductive line which is disposed parallel to the first conductive line, and a pad which is coupled between the first conductive line and the second conductive line and is coupled to the first sub row decoder through a first contact plug. Each of the coupling lines may be routed from both sides of the corresponding pad in the first direction and is electrically coupled to the first sub memory cell array and the second sub memory cell array.

In an embodiment, a semiconductor memory device may include: a plurality of coupling lines each comprising a first conductive line which is disposed in a first direction, and a second conductive line which is disposed parallel to the first conductive line and a pad. The pad of each of the coupling lines may include a quadrangular frame-shaped structural body coupled between the first conductive line and the second conductive line; and an internal line pattern disposed in the first direction, in an internal region surrounded by the quadrangular frame-shaped structural body.

DETAILED DESCRIPTION

Hereinafter, a semiconductor memory device will be described below with reference to the accompanying drawings through various examples of embodiments.

Figure 1:
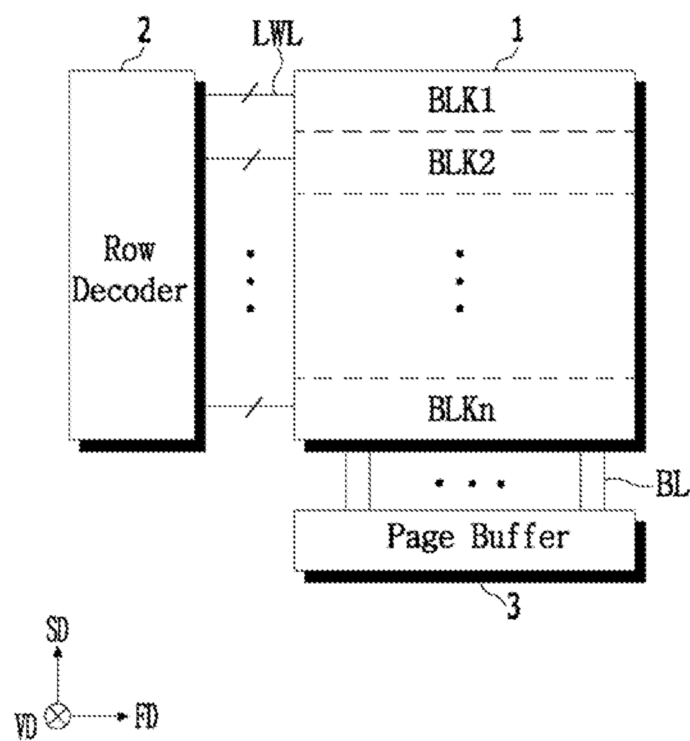
FIG. 1 is a block diagram illustrating a semiconductor memory device in accordance with an embodiment of the present invention.

FIG. 1 is a block diagram illustrating a semiconductor memory device in accordance with an embodiment of the present invention.

Referring to FIG. 1, the semiconductor memory device, in accordance with an embodiment, may include a memory cell array 1, a row decoder 2, and a page buffer 3.

The memory cell array may include a plurality of memory cells, and a plurality of word lines and bit lines BL which are electrically coupled with the memory cells. The memory cell array 1 may include a plurality of memory blocks BLK1 to BLKn. The memory cell array 1 will be described below with reference to FIGS. 2 to 4.

The row decoder 2 may be electrically coupled to the word lines of the memory cell array 1 through coupling lines LWL. The row decoder 2 may select, based on an address information, any one from the memory blocks BLK1 to BLKn of the memory cell array 1. The row decoder 2 may also select any one from the word lines of a selected memory block based on an address information. The row decoder 2 may transfer operation voltages from a voltage generator (not shown), for example a program voltage (Vpgm) a pass voltage (Vpass) and a read voltage (Vread), to the word lines and select lines of a selected memory block. In particular operation voltages of high levels should be provided to the word lines of a selected memory block. In order to transfer high voltages, the row decoder 2 may include pass transistors which are constructed by high voltage transistors.

The page buffer 3 may be electrically coupled to the bit lines BL of the memory cell array 1. The page buffer 3 may temporarily store data to be stored in memory cells or sense data stored in memory cells, depending on an operation mode. The page buffer 3 may operate as a write driver circuit in a program operation mode, and operate as a sense amplifier circuit in a read operation mode.

Figure 2:
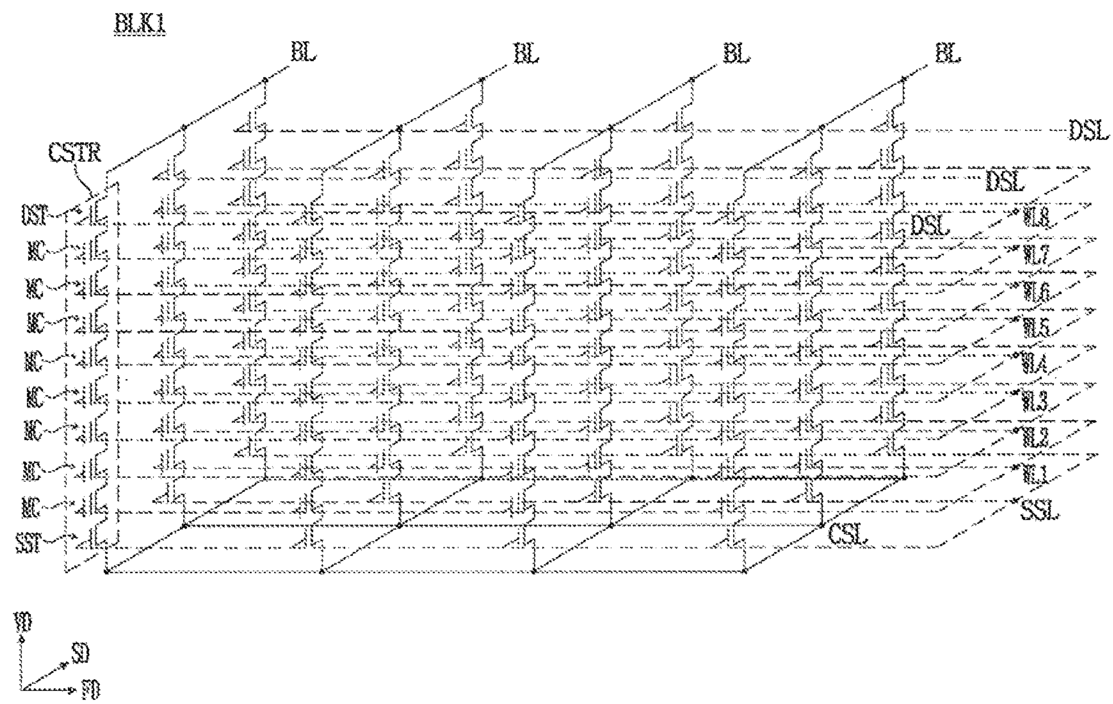
FIG. 2 is an equivalent circuit diagram illustrating one of the memory blocks shown in FIG. 1.

FIG. 2 is a circuit diagram illustrating one memory block BLK1 among the memory blocks BLK1 to BLKn included in the memory cell array 1 of FIG. 1.

Since the memory blocks BLK1 to BLKn are configured in the same manner with one another, descriptions will be made for only a first memory block BLK1.

Referring to FIG. 2, the memory block BLK1 may include a plurality of bit lines BL, a common source line CSL, and a plurality of cell strings CSTR which are disposed between the bit lines BL and the common source line CSL.

The bit lines BL may extend in a second direction SD, and be spaced apart at a regular first interval along a first direction FD. The second direction SD may be a direction perpendicular to the first direction FD. A plurality of cell strings CSTR may be coupled in parallel to each of the bit lines BL. The cell strings CSTR may be coupled in common to the common source line CSL. The cell strings CSTR may each extend in the vertical direction VD and may be spaced part along the first direction FD at the first interval and along the second direction SD at a second interval. The first and second intervals may be the same or different. Hence, a plurality of cell strings CSTR may be disposed between the plurality of bit lines BL and the common source line CSL. For example, as illustrated in FIG. 2, twelve cell strings CSTR may be disposed between four bit lines BL (i.e., three cells strings per bit line) and a common source line CSL Each of the cell strings CSTR may include a source select transistor SST which is coupled to the common source line CSL, a drain select transistor DST which is coupled to a corresponding one of the bit lines BL, and a plurality of memory cells MC which are coupled between the source select transistor SST and the drain select transistor DST. The source select transistor SST, the memory cells MC and the drain select transistor DST may be coupled in series.

A source select line SSL, a plurality of word lines WL1 to WL8 and drain select lines DSL may be disposed between the common source line CSL and the bit lines BL.

The source select line SSL may be coupled to gates of source select transistors SST, and the word lines WL1 to WL8 may be coupled to gates of corresponding memory cells MC. The drain select lines DSL may be coupled to gates of respective drain select transistors DST.

Figure 3:
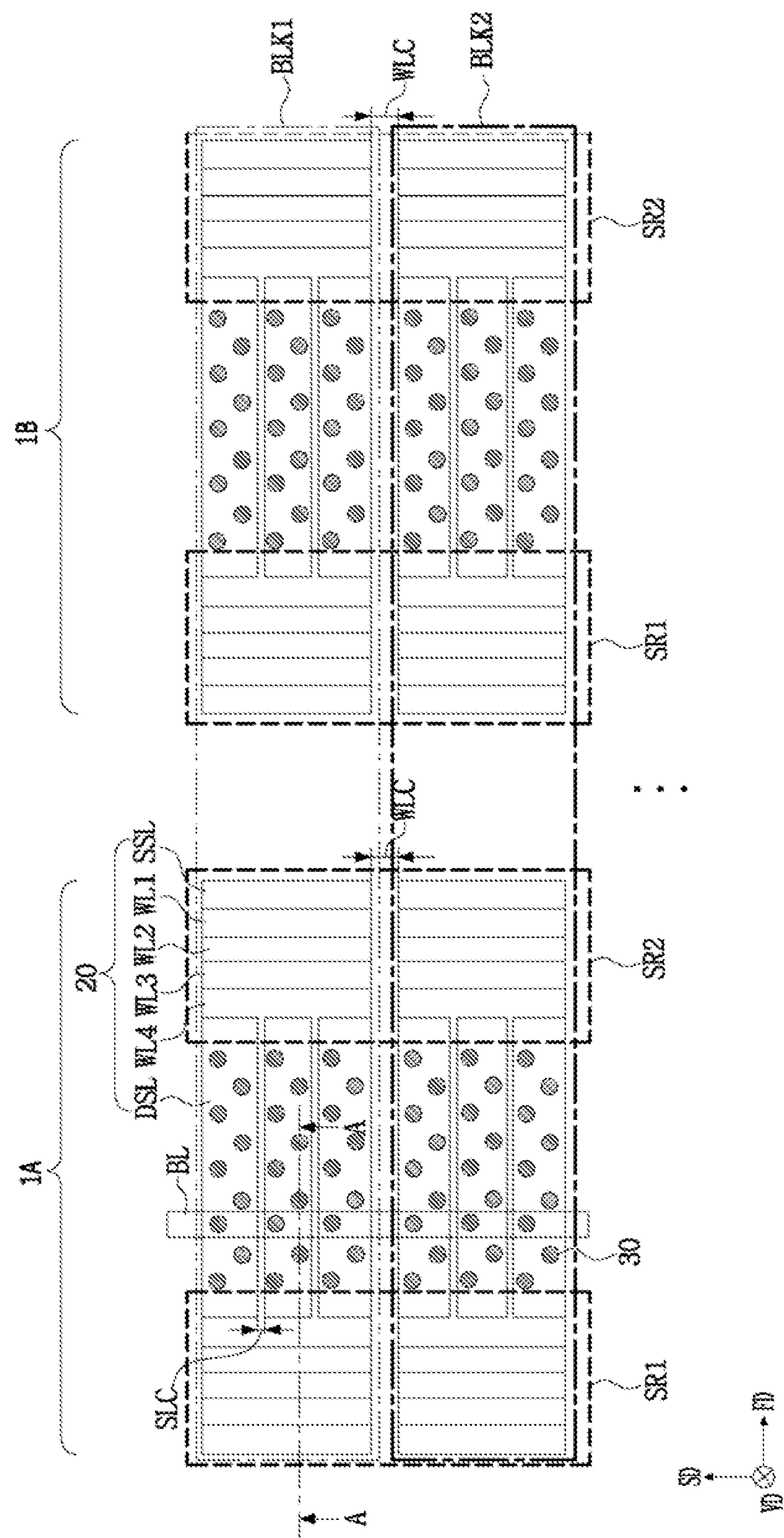
FIG. 3 is a top view schematically illustrating a memory cell array shown in FIG. 1.
Figure 4:
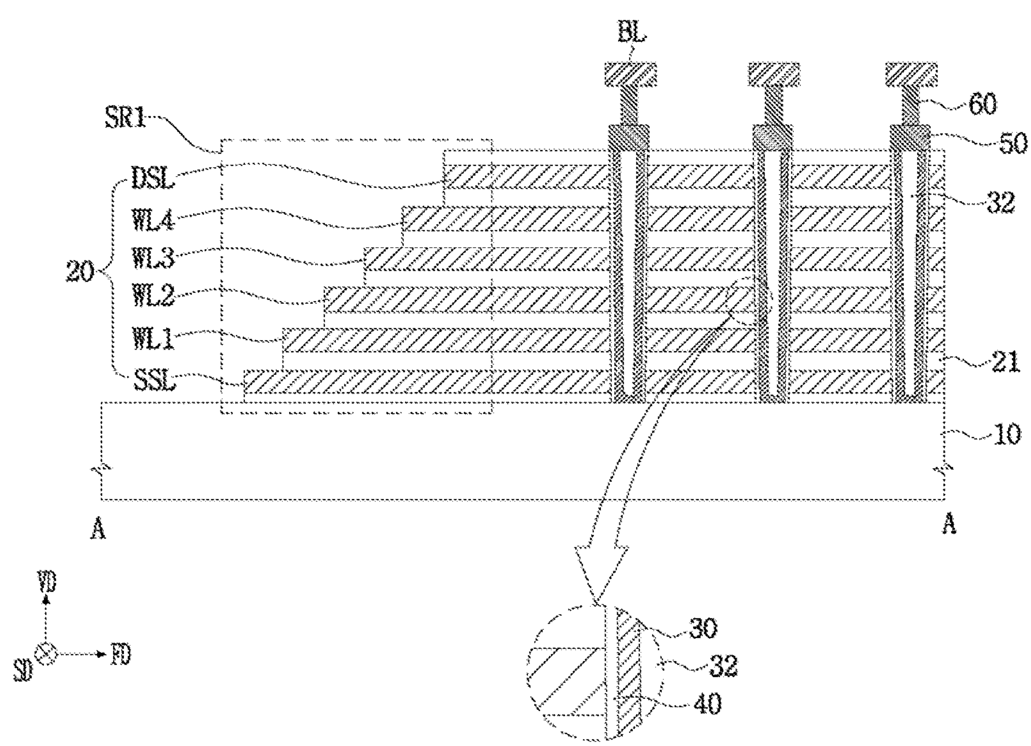
FIG. 4 is a cross-sectional view taken along the line A-A' of FIG. 3.

FIG. 3 is a top view schematically illustrating the memory cell array 1 shown in FIG. 1 and FIG. 4 is a cross-sectional view taken along the line A-A' of FIG. 3.

Referring to FIGS. 3 and 4, the memory cell array 1 may be physically divided into a first sub memory cell array 1A and a second sub memory cell array 1B which are spaced apart along the first direction FD.

By arranging the memory cell array 1 in the two sub memory cell arrays 1A and 1B, the length of word lines may be decreased. As the length of word lines is decreased, the resistance of the word lines is reduced. Therefore, the program speed may be improved by suppressing a drop of the program speed due to an RC delay in the word lines.

The first sub memory cell array 1A and the second sub memory cell array 1B may be configured in the same manner. Each of the first and second sub memory cell arrays 1A and 1B may include a plurality of gate lines 20 which are stacked on a substrate 10.

The substrate 10 may include any suitable semiconductor material, such as, for example, silicon (Si), germanium (Ge) or silicon-germanium (SiGe). Preferably, the substrate 10 may include a polysilicon substrate, a silicon-on-insulator (SOI) substrate or a germanium-on-insulator (GeOI) substrate. While not shown a well region may be formed in the substrate 10. The well region may include a P-type well which is doped with a P-type impurity. The well region may include an N-type well. The well region may be realized as a P-type well and an N-type well formed in the surface of the P-type well, or an N-type well and a P-type well formed in the surface of the N-type well.

The gate lines 20 may be stacked over the well region of the substrate 10. The gate lines 20 may include a source select line SSL, word lines WL1 to WL4 and a drain select line DSL. The source select line SSL, the word lines WL1 to WL4 and the drain select line DSL may be stacked sequentially along the vertical direction VD over the substrate 10. Dielectric layers 21 may be disposed on and under each of the gate lines 20.

The memory cell array 1 may include a plurality of memory blocks BLK1, BLK2, . . . . The gate lines 20 included in the first and second sub memory cell arrays 1A and 1B may be divided by the unit of memory block by word line cut regions WLC. Among the gate lines 20, the drain select line DSL may be divided by select line cut regions SLC.

Channel layers 30 may be formed through the gate lines 20 and the dielectric layers 21 in a vertical direction VD perpendicular to the substrate 10. The bottom surfaces of the channel layers 30 may be brought into contact with the top surface of the substrate 10. The channel layers 30 may be arranged to be separated from one another by a predetermined spacing in the first direction FD and the second direction SD.

In an embodiment, the channel layers 30 may include a polysilicon which is doped with an impurity. In an embodiment, the channel layers 30 may include a polysilicon which is not doped with any impurity. Each of the channel layers 30 may have a tube shape in which a bottom is closed and a center region is opened. An embedded dielectric layer 32 may be filled in the opened center region of each channel layer 30. While not shown, each of the channel layers 30 may have a pillar shape in which a center region is closed. In this case, an embedded dielectric layer may be omitted.

Source select transistors may be formed at regions where the source select line SSL and the channel layers 30 intersect with each other, drain select transistors may be formed at regions where the drain select line DSL and the channel layers 30 intersect with each other, and memory cells may be formed at regions where the word lines WL1 to WL4 and the channel layers 30 intersect with each other. By such a structure, cell strings may be constructed as the source select transistors, the plurality of memory cells and the drain select transistors are coupled in series by the channel layers 30.

A gate dielectric layer 40 which surrounds the outer walls of the channel layers 30 may be formed between the channel layers 30 and the gate lines 20. The gate dielectric layer 40 may include a tunnel dielectric layer, a charge storage layer, and a blocking dielectric layer (not shown). The tunnel dielectric layer may include a silicon oxide, a hafnium oxide, an aluminum oxide, a zirconium oxide or a tantalum oxide. The charge storage layer may include a silicon nitride, a boron nitride, a silicon boron nitride or a polysilicon doped with an impurity. The blocking dielectric layer may include a single layer or a stacked layer of a silicon oxide, a silicon nitride, a hafnium oxide, an aluminum oxide, a zirconium oxide and a tantalum oxide.

A drain region 50 may be formed on the top surface of each of the channel layers 30, the embedded dielectric layer 32 and the gate dielectric layer 40. Each drain region may be co-extensive in the second and first directions SD and FD with the top surface of each of the channel layers 30, the embedded dielectric layer 32 and the gate dielectric layer 40. The drain regions 50 may, for example, include a polysilicon which is doped with an impurity.

A bit line contact 60 may be formed on top of each of the drain regions 50, connecting the drain regions to respective bit lines BL. The bit lines may be formed on the bit line contacts 60 and may extend in the second direction SD. The bit line contacts 60 may be narrower in the first direction than the drain regions 50. The plurality of channel layers 30 which are arranged along the same line in the second direction SD may be electrically coupled by a single bit line BL. While only one bit line BL is illustrated in FIG. 3 for the sake of simplification in illustration it is to be understood that a plurality of bit lines BL are arranged along the first direction FD.

In order for coupling with a row decoder, slimming regions SR1 and SR2 where the source select line SSL, the word lines WL1 to WL4 and the drain select line DSL extend in a step-like shape may be defined at both ends of each of the first and second sub memory cell arrays 1A and 1B. The source select line SSL, the word lines WL1 to WL4 and the drain select line DSL may have the step-like shape in the slimming regions SR1 and SR2.

While it is illustrated in the embodiment of FIGS. 3 and 4 that four word lines are stacked, it is to be noted that the stack number of word lines is not limited thereto. For example, 8, 16, 32 or 64 word lines may be stacked in the vertical direction VD between the source select line SSL and the drain select line DSL.

While it is illustrated in the embodiment of FIGS. 3 and 4 that one source select line SSL and one drain select line DSL are disposed in the vertical direction VD, it is to be noted that in other embodiments at least two source select lines or at least two drain select lines may be disposed in the vertical direction VD.

Figure 5:
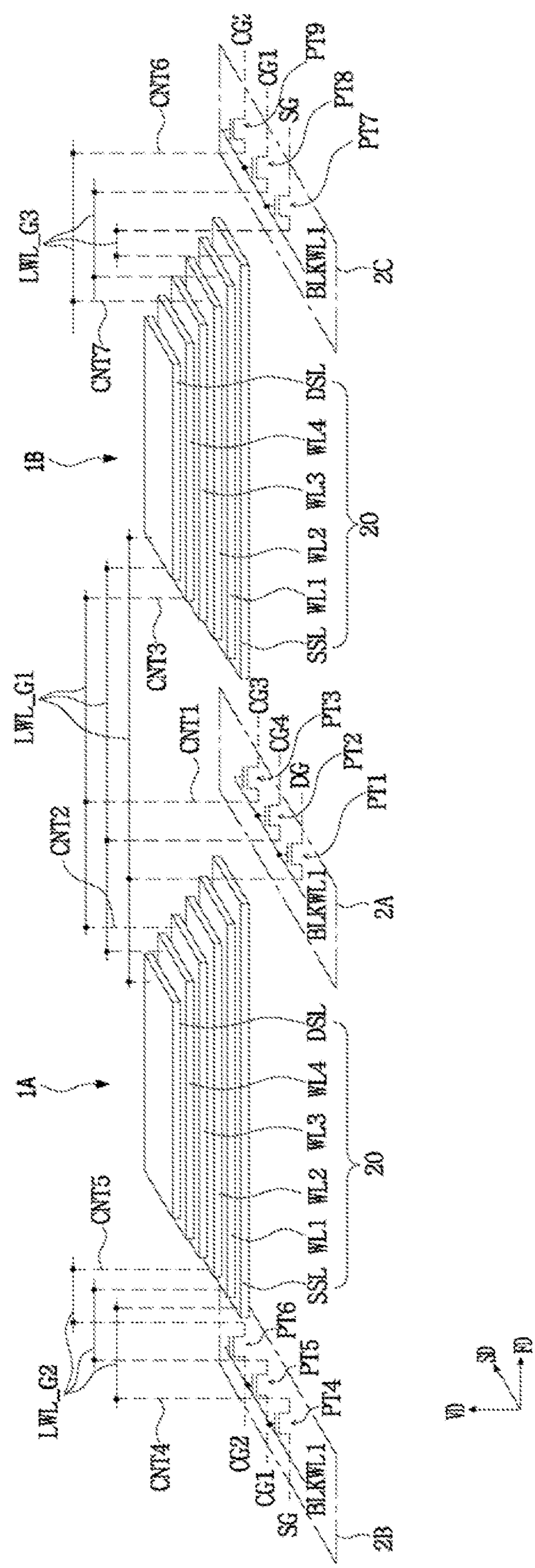
FIG. 5 is a view explaining a coupling relationship of a row decoder and the memory cell array in accordance with an embodiment of the present invention.

FIG. 5 is a view explaining a coupling relationship of the row decoder and the memory cell array in accordance with an embodiment of the present invention.

Referring to FIG. 5, the row decoder may include a first sub row decoder 2A, a second sub row decoder 2B, and a third sub row decoder 2C.

The first sub row decoder 2A may be disposed between the first sub memory cell array 1A and the second sub memory cell array 1B. The second sub row decoder 2B may be disposed adjacent to the first sub row decoder 2A in the first direction FD with the first sub memory cell array 1A interposed therebetween. The third sub row decoder 2C may be disposed adjacent to the first sub row decoder 2A in the first direction FD with the second sub memory cell array 1B interposed therebetween.

Each of the first second and third sub row decoders 2A, 2B and 2C may include a plurality of pass transistors PT1 to PT9.

First to third control gate lines SG, CG1 and CG2 may be respectively coupled to drains of the pass transistors PT4 to PT6 included in the second sub row decoder 2B. The first to third control gate lines SG, CG1 and CG2 may be respectively coupled to drains of the pass transistors PT7 to PT9 included in the third sub row decoder 2C. Fourth to sixth control gate lines CG3, CG4 and DG may be respectively coupled to drains of the pass transistors PT1 to PT3 included in the first sub row decoder 2A.

A block select line BLKWL1 may be coupled to gates of the pass transistors PT1 to PT9. While not illustrated in FIG. 5 for the sake of simplification in illustration, as described above with reference to FIG. 3, the gate lines 20 included in the respective first and second sub memory cell arrays 1A and 1B may be divided by the unit of memory block, and the pass transistors PT1 to PT9 may be disposed in each memory block. Pass transistors corresponding to the same memory block may be coupled to the same block select line, and pass transistors corresponding to different memory blocks may be coupled to different block select lines.

First contact plugs CNT1 may be respectively disposed over sources of the pass transistors PT1 to PT3 included in the first sub row decoder 2A. The first contact plugs CNT1 may be electrically coupled to the sources of the pass transistors PT1 to PT3, respectively, included in the first sub row decoder 2A. Second contact plugs CNT2 may be respectively disposed over the right step portions of some gate lines WL3, WL4 and DSL among the gate lines 20 of the first sub memory cell array 1A. The second contact plugs CNT2 may be electrically coupled to the gate lines WL3, WL4 and DSL of the first sub memory cell array 1A, respectively. Third contact plugs CNT3 may be respectively disposed over the left step portions of some gate lines WL3, WL4 and DSL among the gate lines 20 of the second sub memory cell array 1B. The third contact plugs CNT3 may be electrically coupled to the gate lines WL3, WL4 and DSL of the second sub memory cell array 1B, respectively.

Fourth contact plugs CNT4 may be respectively disposed over sources of the pass transistors PT4 to PT6 included in the second sub row decoder 2B. The fourth contact plugs CNT4 may be electrically coupled to the sources the pass transistors PT4 to PT6, respectively, included in the second sub row decoder 26. Fifth contact plugs CNT5 may be respectively disposed over the left step portions of the remaining gate lines SSL, WL1 and WL2 among the gate lines 20 of the first sub memory cell array 1A. The fifth contact plugs CNT5 may be electrically coupled to the gate lines SSL, WL1 and WL2 of the first sub memory cell array 1A, respectively.

Sixth contact plugs CNT6 may be respectively disposed over sources of the pass transistors PT7 to PT9 included in the third sub row decoder 2C. The sixth contact plugs CNT6 may be electrically coupled to the sources of the pass transistors PT7 to PT9 respectively, included in the third sub row decoder 2C. Seventh contact plugs CNT7 may be respectively disposed over the right step portions of the remaining gate lines SSL, WL1 and WL2 among the gate lines 20 of the second sub memory cell array 1B. The seventh contact plugs CNT7 may be electrically coupled to the gate lines SSL, WL1 and WL2 of the second sub memory cell array 1B, respectively.

The first contact plugs CNT1, the second contact plugs CNT2 and the third contact plugs CNT3 may be electrically coupled with one another through first group coupling lines LWL_G1. The fourth contact plugs CNT4 and the fifth contact plugs CNT5 may be electrically coupled with each other through second group coupling lines LWL_G2. The sixth contact plugs CNT6 and the seventh contact plugs CNT7 may be electrically coupled with each other through third group coupling lines LWL_G3.

The gate lines WL3, WL4 and DSL of the first and second sub memory cell arrays 1A and 1B, may be electrically coupled to one corresponding transistor among the pass transistors PT1, PT2 and PT3 included in the first sub row decoder 2A, through a corresponding line of the first group coupling lines LWL_G1 and may be provided with operation voltages through the corresponding pass transistor. Namely, the first sub row decoder 2A may be shared by the first sub memory cell array 1A and the second sub memory cell array 1B. More specifically, as illustrated in FIG. 5, the gate lines DSL of the first and second sub memory cell arrays 1A and 1B, which are positioned at the same level, may be coupled to the first pass transistor PT1 through a first line of the first group coupling lines LWL_G1. Also, the gate lines WL4 of the first and second sub memory cell arrays 1A and 1B, which are positioned at the same level, may be coupled to the second pass transistor PT2 through a second line of the first group coupling lines LWL_G1, and the gate lines WL3 of the first and second sub memory cell arrays 1A and 1B, which are positioned at the same level, may be coupled to the third pass transistor PT3 through a third line of the first group coupling lines LWL_G1.

Each of the remaining gate lines SSL, WL1 and WL2 of the first sub memory cell array 1A may be electrically coupled to a corresponding pass transistor among the pass transistors PT4, PT5 and PT6 included in the second sub row decoder 26 through a corresponding line among the second group coupling lines LWL_G2, and may be provided with operation voltages through the corresponding pass transistor. Specifically, as illustrated in FIG. 5, gate line SSL of the first sub memory cell array 1A may be electrically coupled to the fourth pass transistor PT4 included in the second sub row decoder 26 through a first line among the second group coupling lines LWL_G2, gate line WL1 of the first sub memory cell array 1A may be electrically coupled to the fifth pass transistor PT5 included in the second sub row decoder 2B through a second line among the second group coupling lines LWL_G2 and gate line WL2 of the first sub memory cell array 1A may be electrically coupled to the sixth pass transistor PT6 included in the second sub row decoder 26 through a third line among the second group coupling lines LWL_G2.

Each of the remaining gate lines SSL, WL1 and WL2 of the second sub memory cell array 1B may be electrically coupled to one of the pass transistors PT7, PT8 and PT9 included in the third sub row decoder 2C through the third group coupling line LWL_G3, and may be provided with operation voltages through the corresponding pass transistor. Specifically, gate line SSL may be electrically coupled to the pass transistor PT7 through a first line of the third group coupling line LWL_G3, gate line WL1 may be electrically coupled to the pass transistor PT8 through a second line of the third group coupling line LWL_G3 and gate line WL2 may be electrically coupled to the pass transistor PT9 through a third line of the third group coupling line LWL_G3.

In order to be stably coupled with the contact plugs CNT1 to CNT7, the respective coupling lines LWL_G1, LWL_G2 and LWL_G3 may include pads which have a width wider than other portions of the lines, at positions overlapping with the contact plugs CNT1 to CNT7.

As the degree of integration is improved, the number of memory cells included in a unit cell string is increasing. Where the number of memory cells included in the unit cell string increases, the number of word lines should be increased by the number of increased memory cells, and the number of coupling lines should be increased by the number of increased word lines. Therefore, it is necessary to form an increased number of coupling lines within a limited area and decrease the line width of coupling lines.

As a technology for forming fine patterns, a spacer patterning technology (SPT) has been suggested. The SPT is a technology using a principle that, by forming one pattern in two pitches and then forming a spacer on each sidewall of the pattern, two spacers are formed on the sidewalls of one pattern. By using such spacers as a mask, the size and spacing of patterns for forming coupling lines may be decreased. However, as spacing between patterns is decreased, the thickness of a dielectric layer between adjacent coupling lines is decreased and the breakdown voltage (BV) of the dielectric layer is reduced, hence, a leakage current is likely to occur. In particular, at a portion where a pad is positioned, since a spacing between coupling lines becomes substantially narrow, it is difficult to secure a BV margin. In the present embodiment, by introducing a new layout structure of coupling lines, the BV characteristic of the coupling lines may be substantially improved.

In order to share the first sub row decoder 2A as shown in FIG. 5 coupling lines should have a structure which allows routing in both left and right directions from the pads coupled to the first contact plugs CNT1. In the present embodiment, a new layout structure of coupling lines which allows routing in both directions is introduced such that two adjacent sub memory cell arrays may share one sub row decoder. As a consequence, when compared to the case where sub row decoders are configured separately for respective sub memory cell arrays, an area occupied by sub row decoders may be reduced, whereby the size of the semiconductor memory device may be reduced.

Figure 6:
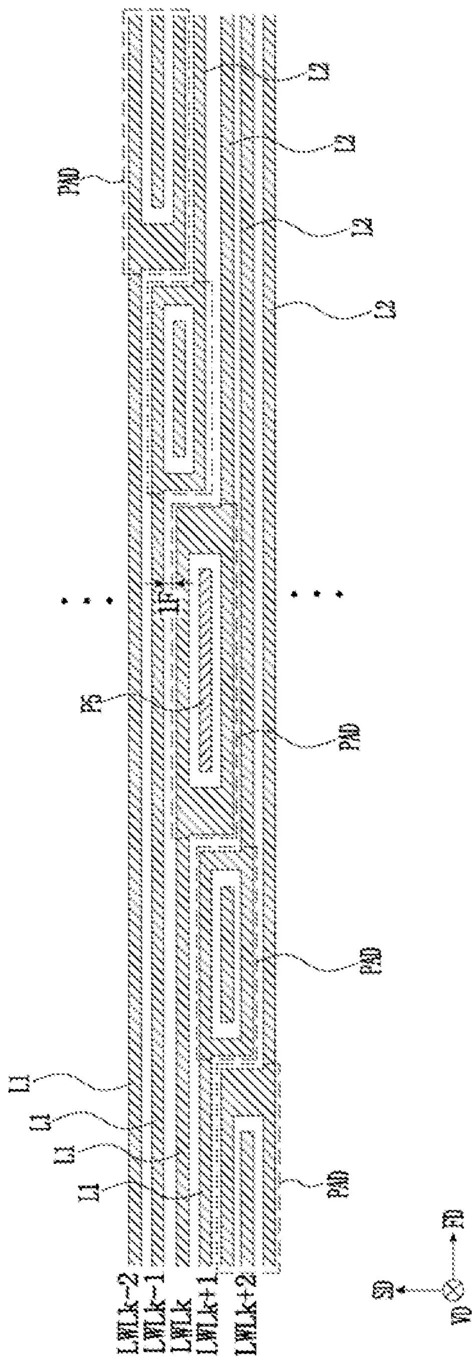
FIG. 6 is a top view illustrating a part of coupling lines of a semiconductor memory device in accordance with an embodiment of the present invention.
Figure 7:
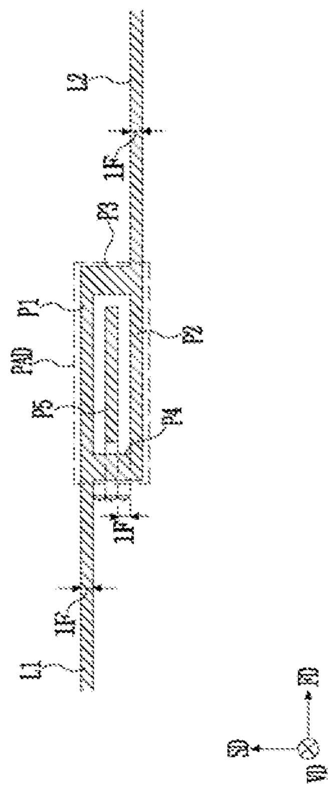
FIG. 7 is a top view illustrating one of the coupling lines illustrated in FIG. 6.

FIG. 6 is a top view illustrating a part of coupling lines of a semiconductor memory device in accordance with an embodiment of the present invention, and FIG. 7 is a top view illustrating a part of one of the coupling lines illustrated in FIG. 6.

Referring to FIG. 6, a plurality of coupling lines, for example, n (n is a natural number equal to or greater than 3) number of coupling lines . . . , LWLk−2, LWLk−1, LWLk, LWLk+1, LWLk+2, . . . (k is a natural number equal to or less than n−2) are formed. These coupling lines . . . , LWLk−2, LWLk−1, LWLk, LWLk+1, LWLk+2, . . . may be the first group coupling lines LWL_G1 described above with reference to FIG. 5, and may electrically couple the gate lines WL3, WL4 and DSL of the first and second sub memory cell arrays 1A, and 1B and the pass transistors PT1, PT2 and PT3 of the first sub row decoder 2A.

The coupling lines . . . , LWLk−2, LWLk−1, LWLk, LWLk+1, LWLk+2, . . . may be any ones of the second group coupling lines LWL_G2 and the third group coupling lines LWL_G3, and may electrically couple the remaining gate lines SSL, WL1 and WL2 of the first sub memory cell array 1A and the pass transistors PT4, PT5 and PT6 of the second sub row decoder 2B, or electrically couple the remaining gate lines SSL, WL1 and WL2 of the second sub memory cell array 1B and the pass transistors PT7, PT8 and PT9 of the third sub row decoder 2C.

The coupling lines . . . , LWLk−2, LWLk−1, LWLk, LWLk+1, LWLk+2, . . . may be disposed on the same plane, and be arranged along the second direction SD.

Referring to FIG. 7, each of the coupling lines . . . , LWLk−2, LWLk−1, LWLk, LWLk+1, LWLk+2, may include a first conductive line L1 extending in the first direction FD, a second conductive line L2 extending parallel to the first conductive line L1, and a pad PAD which is coupled between the first conductive line L1 and the second conductive line L2.

Each of the first conductive line L1 and the second conductive line L2 may have a width of 1F as a minimum feature size. In each of the coupling lines . . . , LWLk−2, LWLk−2, LWLk, LWLk+1, LWLk+2, . . . , the spacing between the first conductive line L1 and the second conductive line L2 in the second direction SD may have a size of 3F.

In each of be coupling lines . . . , LWLk−2, LWLk−1, LWLk, LWLk+1, LWLk+2, . . . , the first conductive line L1 and the second conductive line L2 may extend in opposite directions from the pad PAD. For example, the first conductive line L1 may extend leftward in the first direction FD from the pad PAD, and the second conductive line L2 may extend rightward in the first direction FD from the pad PAD.

The pad PAD may include a quadrangular frame-shaped structural body which is made up of first to fourth line patterns P1, P2, P3 and P4. The first line pattern P1 may have a width substantially the same as the first conductive line L1, and extend rightward in the first direction FD from the end of the first conductive line L1. The second line pattern P2 may have a width substantially the same as the second conductive line L2, and extend leftward in the first direction FD from the end of the second conductive line L2. The third line pattern P3 may extend downward in the second direction SD from the end of the first line pattern P1 to the second line pattern P2. The fourth line pattern P4 may extend upward in the second direction SD from the end of the second line pattern P2 to the first line pattern P1.

The pad PAD may further include an internal line pattern P5 which is disposed parallel to the first and second line patterns P1 and P2 in an internal region defined by the first to fourth line patterns P1, P2, P3 and P4. The internal line pattern P5 may have a width of 1F. The spacing between the first line pattern P1 and the internal line pattern P5 and the spacing between the second line pattern P2 and the internal line pattern P5 may have a size of 1F.

Referring back to FIG. 6, the coupling lines . . . , LWLk−2, LWLk−1, LWLk, LWLk+1, LWLk+2, . . . may be configured in such a manner that each pad PAD does not overlap with the pads PAD of other adjacent coupling lines in the second direction SD The pad PAD of each of the coupling lines . . . , LWLk−2, LWLk−1, LWLk, LWLk+1, LWLk+2, . . . may overlap with the first conductive line L1 or the second conductive line L2 of another adjacent coupling line in the second direction SD. In particular, the pad PAD of each of the coupling lines . . . , LWLk−2, LWLk−1, LWLk, LWLk+1, LWLk+2, . . . may overlap with the first conductive line L1 of another adjacent coupling line at an upper portion in the second direction SD, and may overlap with the second conductive line L2 of another adjacent coupling line at a lower portion in the second direction SD.

The pads PAD of the coupling lines . . . , LWLk−2, LWLk−1, LWLk, LWLk+1, LWLk+2, . . . may be arranged in a direction oblique to the first direction FD and the second direction SD.

Among the coupling lines . . . , LWLk−2, LWLk−1, LWLk, LWLk+1, LWLk+2, . . . , the second conductive line L2 of the (k−1)th coupling line LWLk−1 may be disposed on the same line as the first conductive line L1 of the (k+1)th coupling line LWLk+1. The internal line pattern P5 Included in the pad PAD of the kth coupling line LWLk may be disposed on the same line as the second conductive line L2 of the (k−1)th coupling line LWLk−1 and the first conductive line L1 of the (k+1)th coupling line LWLk+1.

The first conductive lines L1, the second conductive lines L2 and the pads PAD of the coupling lines . . . , LWLk−2, LWLk−1, LWLk, LWLk+1, LWLk+2, . . . may be formed simultaneously by applying an SPT process to a mask pattern of a specific shape which may be implemented by a lithography technology. In order to form the structure of the first conductive lines L1, the second conductive lines L2 and the pads PAD as in the present embodiment, an appropriate mask pattern structure should be formed initially through a photolithography process. Such a mask pattern structure will be described later with reference to FIGS. 9A and 9B.

Figure 8A:
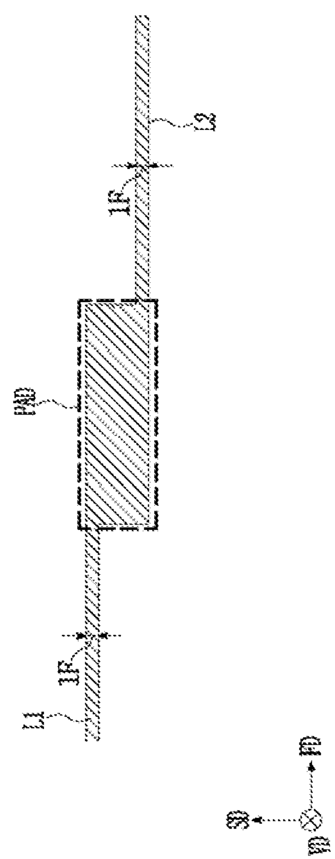
FIGS. 8A to 8C are top views illustrating various exemplary shapes of coupling lines.

While it is illustrated in the embodiment of FIGS. 6 and 7 that the pad PAD is made up of a quadrangular frame-shaped structural body which is formed by the first to fourth line patterns P1, P2, P3 and P4 and the internal line pattern P5 which is disposed in the internal region defined by the quadrangular frame-shaped structural body, it is to be noted that the disclosure is not limited to such an embodiment and various changes may be made within the scope of the disclosure. For example, as shown in FIG. 8A the pad PAD may have a solid rectangular structure without an internal region pattern. The shape of the quandragular pad may be a square instead of a rectangle.

While it is illustrated in the embodiment of FIGS. 6 and 7 that the first conductive line L1 and the second conductive line L2 extend in opposite directions from the pad PAD, it is to be noted that the disclosure is not limited to such an embodiment and various changes may be made within the scope of the disclosure.

Figure 8B:
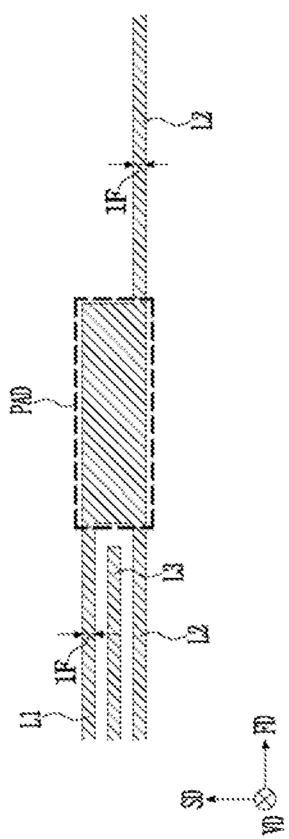

For example, as shown in FIG. 8B, the second conductive line L2 may extend in both directions from the pad PAD, while the first conductive line L1 may extend in only one direction from the pad PAD. Conversely, while not shown, the first conductive line L1 may extend in both directions from the pad PAD, while the second conductive line L2 may extend in only one direction from the pad PAD. At this time, a third conductive line L3 may be disposed between the first conductive line L1 and the second conductive line L2 in the first direction FD.

Figure 8C:
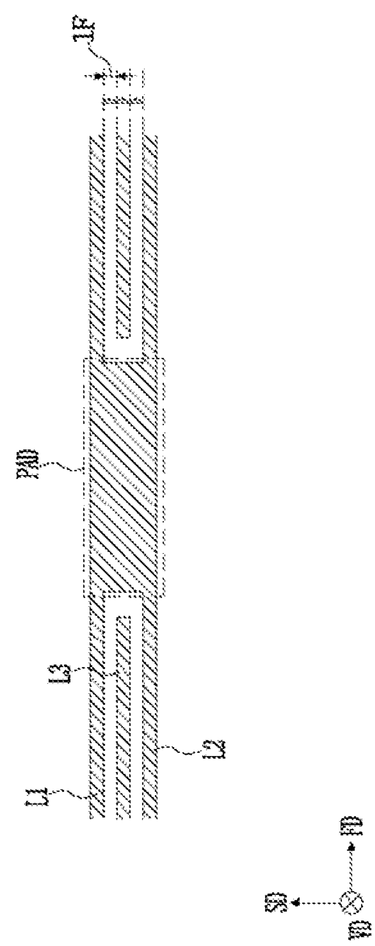

In yet another variation of the present embodiment, as shown in FIG. 8C, both the first conductive line L1 and the second conductive line L2 may extend in both directions from the pad PAD. In this case, the first conductive line L1 and the second conductive line L2 may be disposed to overlap at least partially in the second direction SD. Between the first conductive line L1 and the second conductive line L2 which overlap with each other, a third conductive line L3 may be disposed in a direction parallel to the first and second conductive lines L1 and L2, that is, in the first direction FD.

The width of the third conductive line L3 in the second direction SD may be 1F, and each of the spacing between the first conductive line L1 and the third conductive line L3 and the spacing between the second conductive line L2 and the third conductive line L3 in the second direction SD may be 1F.

FIGS. 9A to 16B are views explaining a process for forming coupling lines of a semiconductor memory device in accordance with an embodiment of the present invention.

Figure 9A:
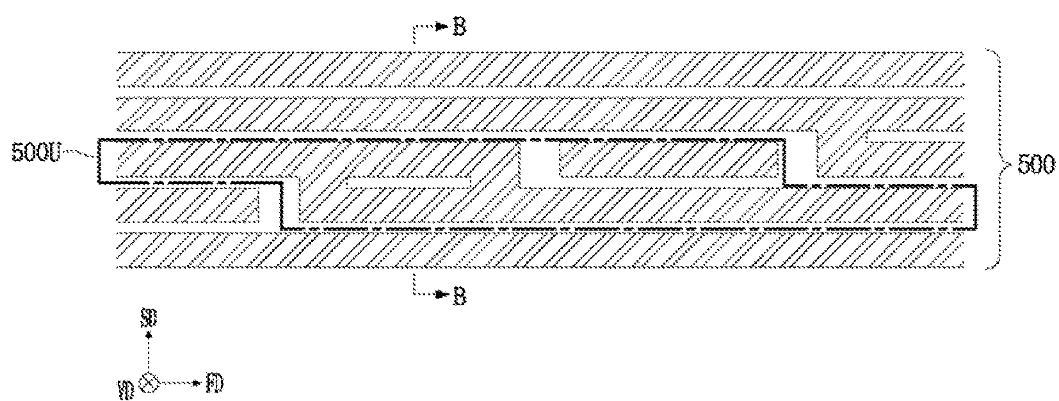
FIGS. 9A, 10A, 11A, 12A, 13A, 14A, 15A and 16A are top views illustrating the respective steps of a process for forming the coupling lines of the semiconductor memory device in accordance with the embodiment of the present invention.
Figure 9B:
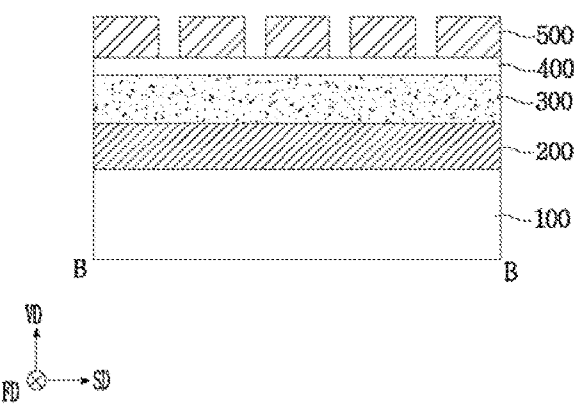
FIGS. 9B, 10B, 11B, 12B, 13B, 14B, 15B and 16B are cross-sectional views taken along the lines B-B of FIGS. 9A, 10A, 11A, 12A, 13A, 14A, 15A and 16A.
Figure 9C:
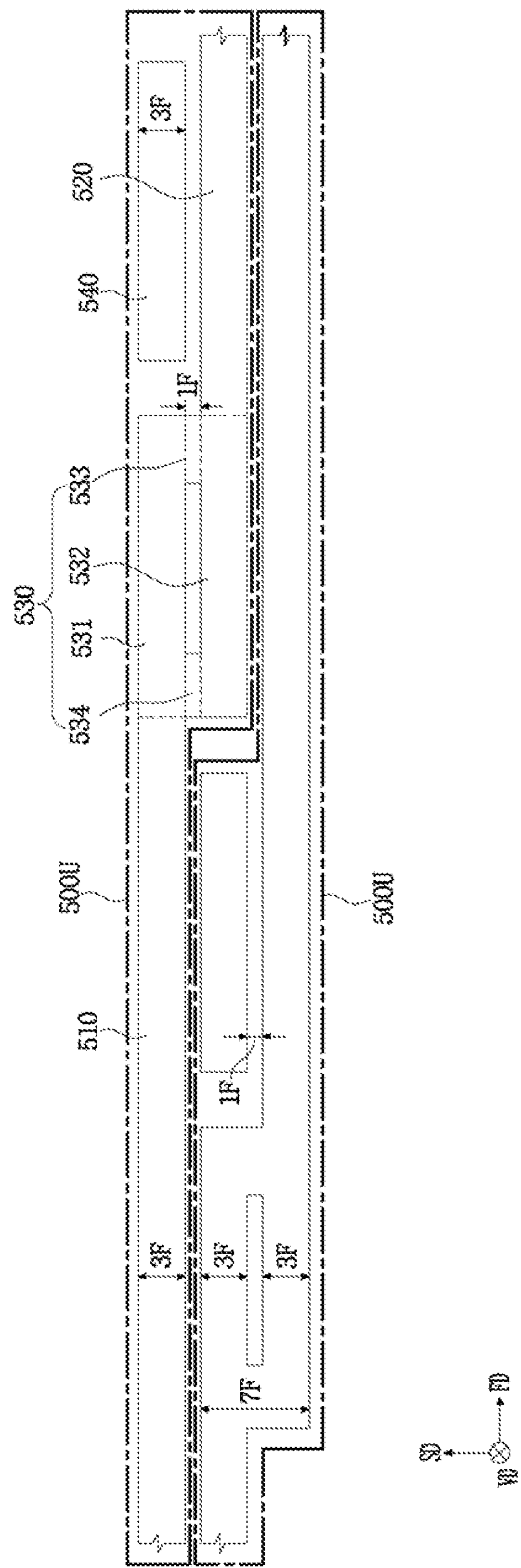
FIG. 9C is a top view illustrating exemplary two-unit ask patterns disposed adjacent to each other, among the unit mask patterns illustrated in FIG. 9A.

FIGS. 9A, 10A, 11A, 12A, 13A, 14A, 15A and 16A are top views explaining a process for forming the coupling lines of the semiconductor memory device in accordance with the embodiment, FIGS. 9B, 10B, 11B, 12B, 13B, 14B, 15B and 16B are cross-sectional views taken along the lines B-B of FIGS. 9A, 10A, 11A, 12A, 13A, 14A, 15A and 16A, respectively, and FIG. 9C is a top view illustrating two unit mask patterns which are disposed adjacent to each other, among the unit mask patterns illustrated in FIG. 9A.

Referring to FIG. 9B, an interlayer dielectric layer 100 which covers a memory cell array (not shown) and a row decoder (not shown) may be formed on a substrate. A conductive layer 200, a dielectric layer 300 and an antireflection layer 400 are sequentially formed on the interlayer dielectric layer 100, and a first mask pattern 500 having openings which expose the antireflection layer 400 in a predetermined form is formed on the antireflection layer 400.

The conductive layer 200 as a target layer in which coupling lines are formed may be made of a metal, a metal nitride, a doped polysilicon or a combination thereof.

The dielectric layer 300 as a hard mask layer may be formed as a single layer structure or a multilayer structure. Where the dielectric layer 300 is formed as a multilayer structure, the dielectric layer 300 may have a structure in which at least two hard mask layers, that is, a plurality of hard mask layers, having different etching characteristics in a predetermined etching condition are stacked. The dielectric layer 300 may be formed of a material which may be easily removed through ashing and stripping processes.

The antireflection layer 400 as a layer which performs an antireflection function in a photolithography process may be formed as a single layer or a multilayer. Where the antireflection layer 400 is formed as a single layer, the antireflection layer 400 may be formed as a silicon oxynitride (SiON) layer. Where the antireflection layer 400 is formed as a multilayer, the antireflection layer 400 may be formed as a structure in which a SiON layer and an organic antireflection layer are stacked.

The first mask pattern 500 may be formed by using a photoresist as a material, and may be patterned into a specific shape through a photolithography process.

Referring to FIG. 9A, the first mask pattern 500 may include a plurality of unit mask patterns 500U which are formed according to a specific standard. The unit mask patterns 500U may be arranged in a direction oblique to the first direction FD and the second direction SD, and may have substantially the same structure.

Two unit mask patterns 500U which are disposed adjacent to each other are illustrated in FIG. 9C.

Referring to FIG. 9C, each of the unit mask patterns 500U may include a first pattern 510 of a line shape extending in the first direction FD and having a width in the second direction SD of 3F, a second pattern 520 of a line shape which is disposed parallel to the first pattern 510 and having a width in the second direction SD of 3F, a third pattern 530 of a quadrangular frame shape which is coupled between the first pattern 510 and the second pattern 520, and a fourth pattern 540 of an island shape which is disposed over the second pattern 520 and rightward of the third pattern 530 while being spaced apart from the third pattern 530.

The first and second patterns 510 and 520 may be mask portions which are provided to form the first and second conductive lines (L1 and L2 of FIG. 7) of coupling lines, and the third and fourth patterns 530 and 540 may be mask portions which are provided to form the pads (PAD of FIG. 7) of the coupling lines.

The third pattern 530 may be defined by first and second portions 531 and 532 extending in parallel along first direction, and third and fourth portions 533 and 534 extending in parallel along the second direction SD. The first portion 531 has a line shape extending rightward in the first direction FD from a right end of the first pattern 510, the second portion 532 has a line shape extending leftward in the first direction FD from a left end of the second pattern 520, the third portion 533 has a line shape extending in the second direction SD connecting the right ends of the first and second portions 531 and 532, and the fourth portion 534 has a line shape extending in the second direction SD connecting the left ends of the first and the second portions 531 and 531. The third pattern 530 may be provided in a quadrangular frame shape such as a rectangular or a square frame shape by the first to fourth portions 531, 532, 533 and 534.

The first portion 531 of the third pattern 530 may be disposed on the same One as the first pattern 510, and have the width of 3F in the second direction SD, which is the same size as the width of the first pattern 510. The second portion 532 of the third pattern 530 may be disposed on the same line as the second pattern 520, and have the width of 3F in the second direction SD, which is the same size as the width of the second pattern 520. The spacing between the first portion 531 of the third pattern 530 and the second portion 532 of the third pattern 530 in the second direction SD may have a size of 1F.

The fourth pattern 540 may be disposed on the same line as the first pattern 510 and the first portion 531 of the third pattern 530, and have the width of 3F in the second direction SD, which is the same size as the width of each of the first pattern 510 and the first portion 531 of the third pattern 530. The fourth pattern 540 may be separated by a spacing of 1F from the second pattern 520 in the second direction SD. The fourth pattern 540 may be separated by a spacing from the third pattern 530 in the first direction SD also.

The unit mask patterns 500U may be shifted sequentially in an oblique direction crossing with the first direction FD and the second direction SD such that the third pattern 530 of each unit mask patterns 500U and the fourth pattern 540 of another adjacent unit mask pattern 500U do not overlap with each other in the second direction S.

In each unit mask pattern 500U, the fourth pattern 540 may be disposed rightward of the first portion 531 of the third pattern 530 while being spaced apart from the first portion 531 of the third pattern 530. The fourth pattern 540 of each unit mask pattern 500U may be disposed leftward of the second portion 532 of the third pattern 530 of another adjacent unit mask pattern 500U while being spaced apart from the second portion 532.

The spacing between the third pattern 530 and the fourth pattern 540 in the first direction FD is not limited specifically, but may be larger than 1F such that a second mask layer may be easily formed in a subsequent process. The lengths of the third pattern 530 and the fourth pattern 540 in the first direction FD are not limited, but may be set to predetermined lengths in consideration of the sizes of contact plugs to be, coupled to the pads of coupling lines.

Figure 10A:
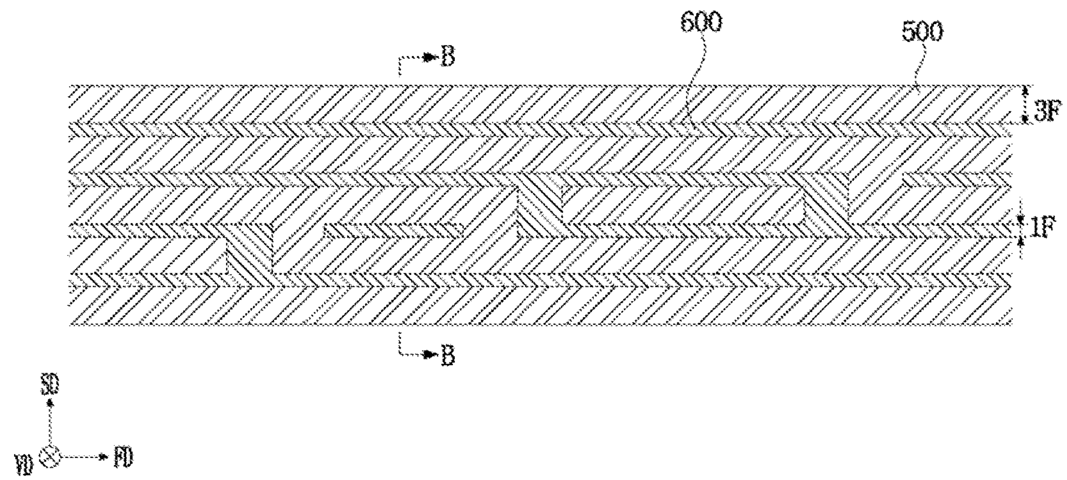
Figure 10B:
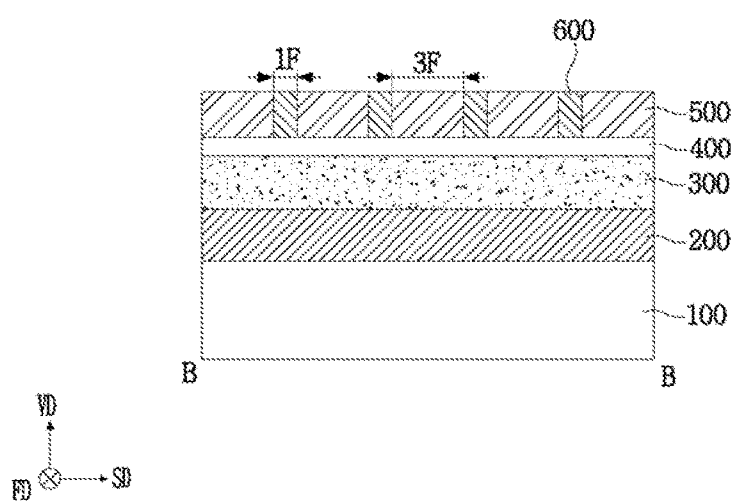

Referring to FIGS. 10A and 10B, by forming on the first mask pattern 500 and the antireflection layer 400 a second mask layer through using a material having an etching selectivity to the first mask pattern 500 and by removing the second mask layer formed on the first mask pattern 500 through a planarization process to expose the first mask pattern 500, a second mask pattern 600 is formed in the openings of the first mask pattern 500. The width of the second mask pattern 600 in the second direction SD may be 1F.

Figure 11A:
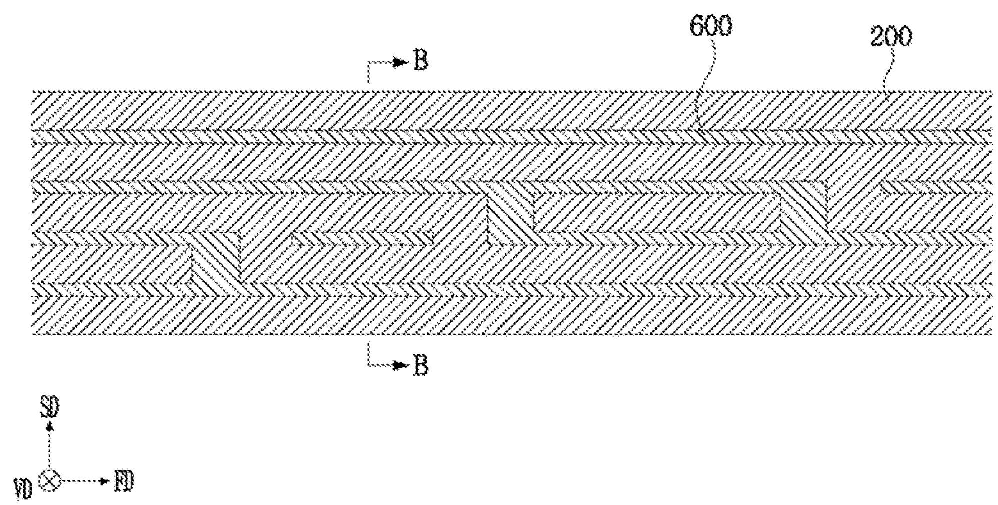
Figure 11B:
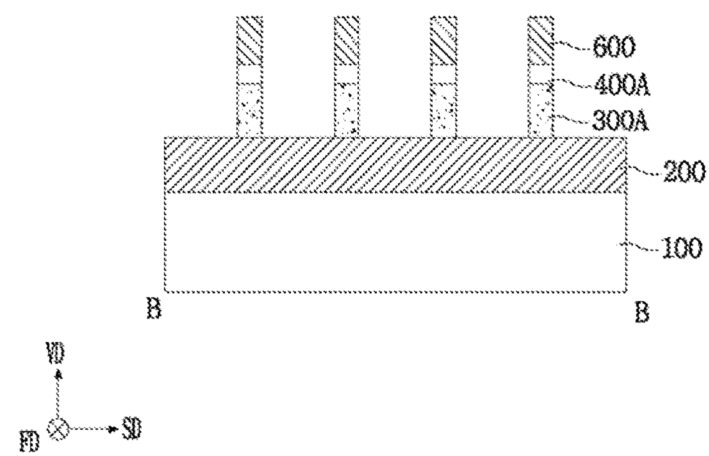

Referring to FIGS. 11A and 11B, by removing the first mask pattern 500 to leave the second mask pattern 600 and by etching the antireflection layer 400 and the dielectric layer 300 through using the second mask pattern 600 as an etch mask, an antireflection layer patter 400A and a dielectric layer pattern 300A are formed.

A process for removing the first mask pattern 500 may be performed under a condition in which etching of the second mask pattern 600 and the antireflection layer 400 is suppressed. As the process for removing the first mask pattern 500, for example, ashing and stripping processes may be used. Further, depending on the material of the antireflection layer 400, the first mask pattern 500 may be removed by using a dry or wet etching process.

Since the dielectric layer pattern 300A is formed through using the second mask pattern 600 as an etch mask, the dielectric layer pattern 300A may have the same planar structure as the second mask pattern 600. The second mask pattern 600 and the antireflection layer pattern 400A may be removed as they are etched partially or entirely in the process of etching the dielectric layer 300.

Figure 12A:
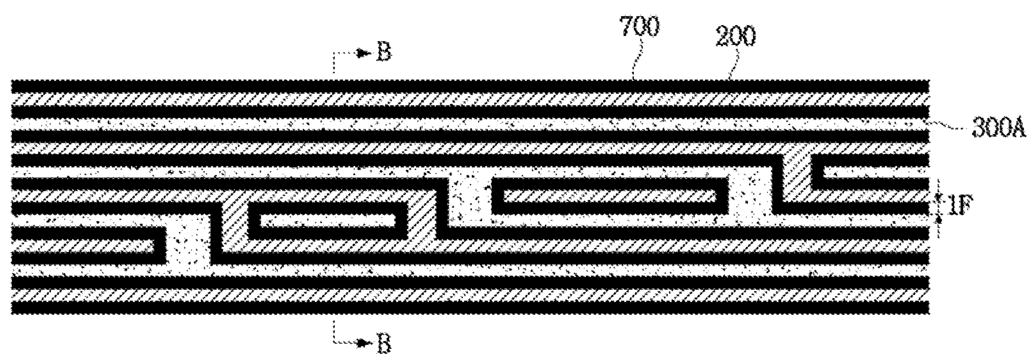
Figure 12B:
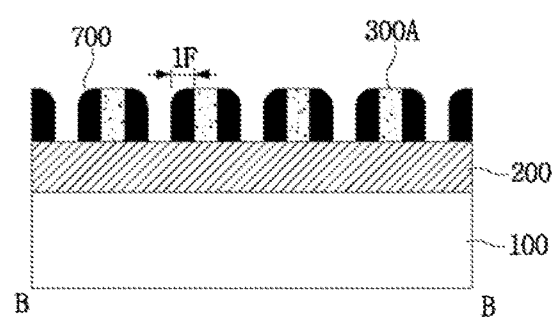
Figure 12B:
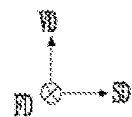

Referring to FIGS. 12A and 12B, after removing the second mask pattern 600 and the antireflection layer pattern 400A, spacers 700 are formed on sidewalk of the dielectric layer pattern 300A through using a material having an etching selectivity to the dielectric layer pattern 300A.

The spacers 700 may be formed by forming a spacer layer on the conductive layer 200 and the dielectric layer pattern 300A to a uniform thickness, for example, a thickness of 1F as a target size for the spacing between coupling lines and by etching back the spacer layer until the conductive layer 200 is exposed. When forming the spacer layer, in order to form the spacer layer to a uniform thickness, an atomic layer deposition (ALD) process may be used.

The spacers 700 may be formed into a structure which surrounds the entire sidewalls of the dielectric layer pattern 300A as shown in FIG. 12A. The spacers 700 may be formed on the conductive layer 200 with a uniform width of 1F.

Figure 13A:
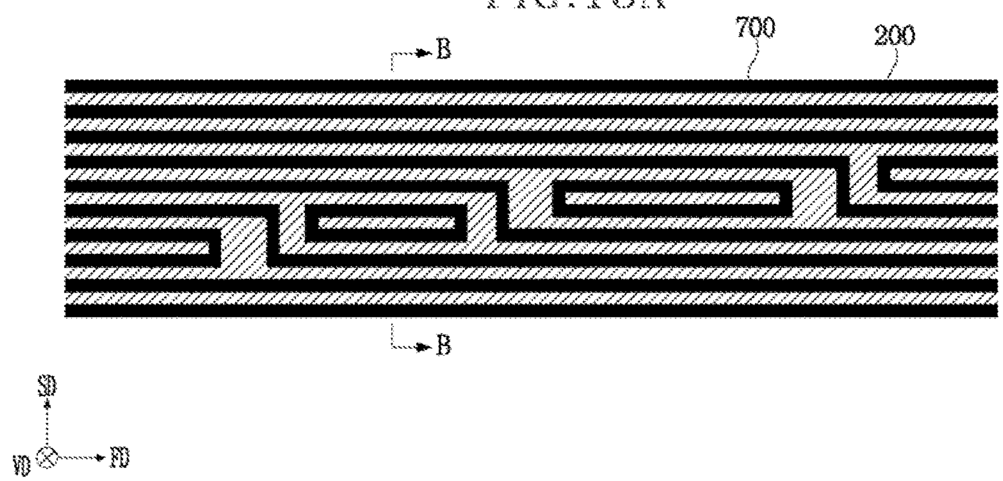
Figure 13B:
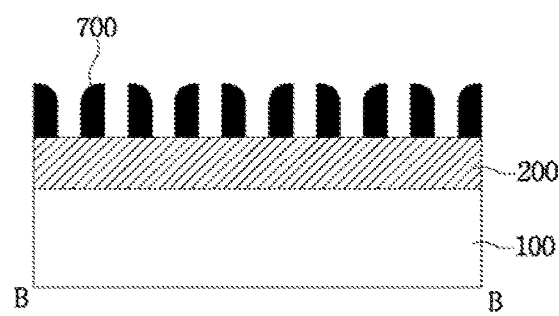

Referring to FIGS. 13A and 13B, the dielectric layer pattern 300A is removed in such as way as to leave the spacers 700 on the conductive layer 200. A process for removing the dielectric layer pattern 300A may be performed under a condition in which etching of the spacers 700 and the conductive layer 200 is suppressed.

Figure 14A:
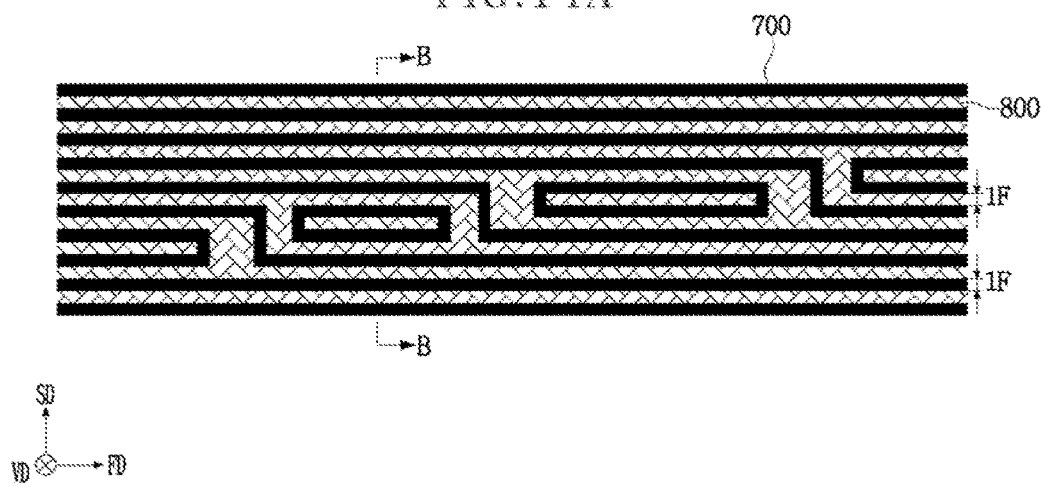
Figure 14B:
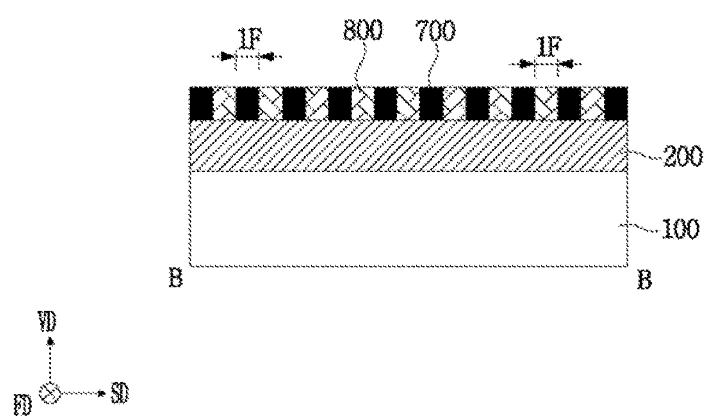

Referring to FIGS. 14A and 14B, by forming on the spacers 700 and the conductive layer 200 a third mask layer through using a material having an etching selectivity to the spacers 700 and the conductive layer 200 and by planarizing the spacers 700 and the third mask layer such that the spacers 700 are removed by a predetermined thickness, a third mask pattern 800 is formed between the spacers 700.

The spacing of the third mask pattern 800 may be 1F that is the same as the width of the spacers 700, and the width of the third mask pattern 800 in be second direction SD may be 1F.

Figure 15A:
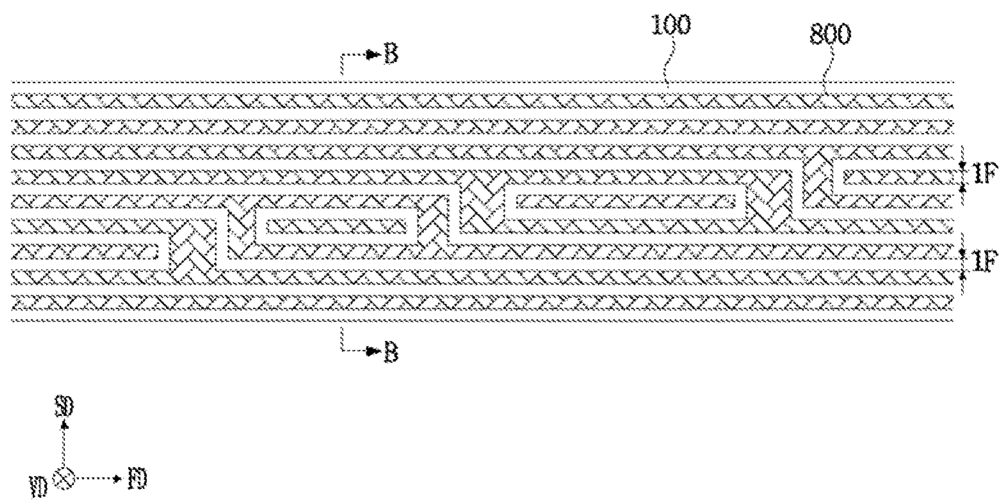
Figure 15B:
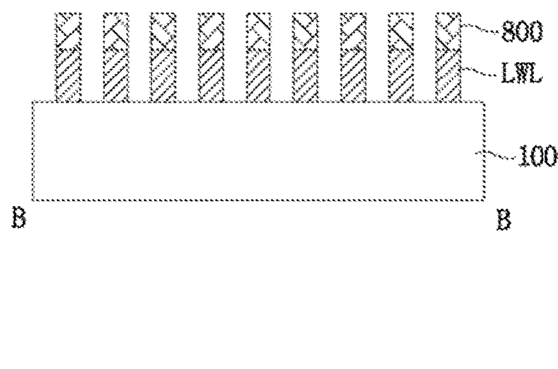

Referring to FIGS. 15A and 15B, by removing the spacers 700 to leave the third mask pattern 800 on the conductive layer 200 and by etching the conductive layer 200 through using the third mask pattern 800 as an etch mask, coupling lines LWL are formed on the interlayer dielectric layer 100.

Since the coupling lines LWL are formed through using the third mask pattern 800 as an etch mask, the coupling lines LWL may have the same planar structure as the third mask pattern 800. Therefore, the spacing of the coupling lines LWL may have a constant size of 1F, and the width of the coupling lines LWL in the second direction SD may be 1F.

Figure 16A:
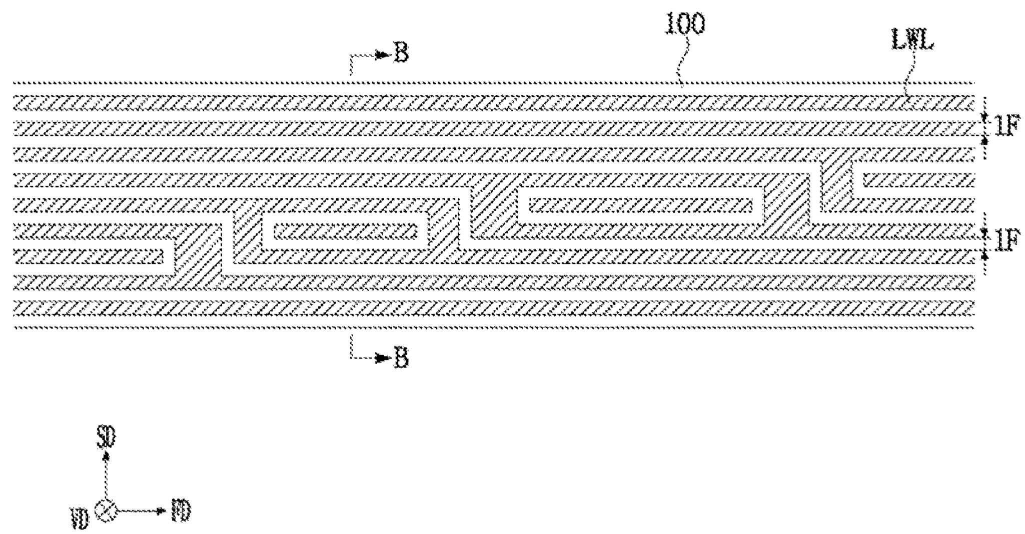
Figure 16B:
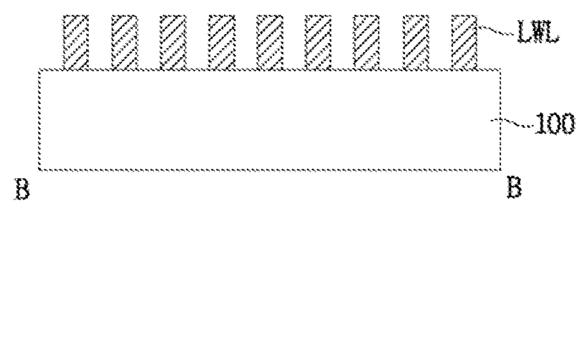

Thereafter, by removing the third mask pattern 800, only the coupling lines LWL as a final target structure are left as shown in FIGS. 16A and 16B. Since the structure of the coupling lines LWL was described above with reference to FIGS. 6 and 7 detailed descriptions thereof will be omitted herein.

According to the present embodiment, it is possible to form the coupling lines LWL having pads at regular spacings. Therefore, it is possible to address a concern that it is difficult to secure a BV margin since spacings between coupling lines become narrow due to the presence of pads.

Moreover, the first conductive lines L1, the second conductive lines L2 and the pads PAD of the coupling lines LWL may be formed simultaneously by applying an SPT process to a mask pattern of a predetermined shape which may be implemented by a lithography technology known in the art. As a consequence a separate photolithography process for forming pads is not needed, and it is possible to address a concern that a sufficient processing margin should be secured to form pads.

Figure 17:
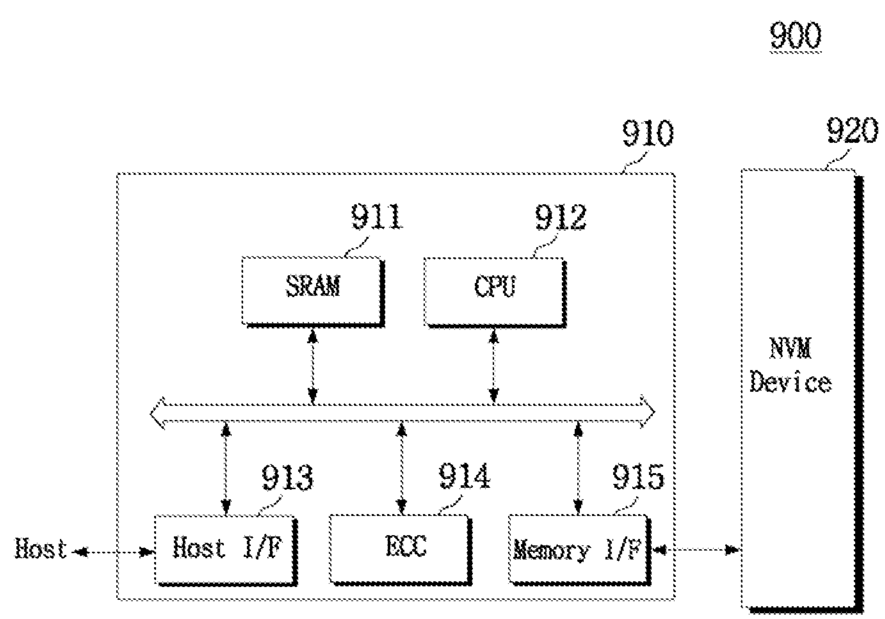
FIG. 17 is a block diagram schematically illustrating a memory system including a semiconductor memory device in accordance with an embodiment of the present invention.

FIG. 17 is a block diagram schematically illustrating a memory system 900 including a semiconductor memory device 920, according to an embodiment of the present invention.

Referring to FIG. 17, the memory system 900 may include a memory controller 910 and the semiconductor memory device 920. The semiconductor memory device 920 may include a semiconductor memory, according to an embodiment of the invention as described above. The semiconductor memory device 920 may include a nonvolatile memory (NW) device. The memory controller 910 may control the semiconductor memory device 920. The combination of the semiconductor memory device 920 and the memory controller 910, may be configured as a memory card or a solid state disk (SSD).

The memory controller 910 may include a SRAM 911, a central processing unit (CUP) 912, a host interface 913, an error correction code (ECC) block 914, and a memory interface 915, which are electrically coupled via an internal bus. The SRAM 911 may be used as the working memory of the CPU 912. The host interface 913 may include the data exchange protocol of a host which may be coupled with the memory system 900. All these components are well known in the art and, hence, will not be described in detail.

The ECC block 914 may detect and correct an error included in the data read out from the semiconductor memory device 920.

The memory interface 915 may interface with the semiconductor memory device 920. The CPU 912 may perform general control operations for data exchange of the memory controller 910.

Although not shown, it should become apparent to a person skilled in the art that the memory system 900 may further be provided with a ROM which stores code data for interfacing with the host. The semiconductor memory device 920 may be provided as a multi-chip package constructed by a plurality of flash memory chips.

The memory system 900 may be used as a storage medium of high reliability having a low probability of an error occurring. The aforementioned nonvolatile memory device may be provided in a memory system as a solid state disk (SSD). The memory controller 910 may communicate with an external device for example, the host through one of various interface protocols such as an universal serial bus (USB) protocol, a multimedia card (MMC) protocol, a peripheral component interconnection express (PCI-E) protocol, a serial advanced technology attachment (SATA) protocol, a parallel advanced technology attachment (PATA) protocol, a small computer system interface (SCSI) protocol, an enhanced small disk interface (ESDI) protocol and an integrated device electronics (IDE) protocol and the like.

Figure 18:
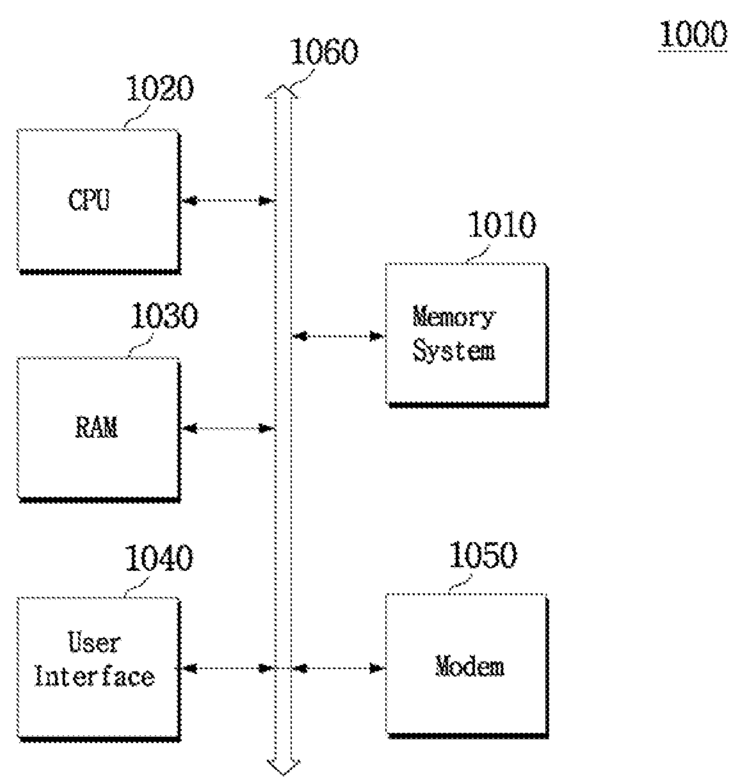
FIG. 18 is a block diagram schematically illustrating a computing system including a semiconductor memory device in accordance with an embodiment of the present invention.

FIG. 18 is a block diagram schematically illustrating a computing system 1000 including a semiconductor memory device, according to an embodiment of the present invention.

Referring to FIG. 18, the computing system 1000 according to an embodiment may include a microprocessor (or CPU) 1020, a RAM 1030, a user interface 1040, a modem 1050 such as a baseband chipset, and a memory system 1010, which are electrically coupled to a system bus 1060. In an embodiment, the computing system 1000 may be a mobile device, in which case a battery (not shown) for supplying the operating voltage of the computing system 1000 may be additionally provided. Although not shown in the drawing, it should become apparent to a person skilled in the art that the computing system 1000 may further comprise an application chipset, a COMS image sensor (CIS), a mobile DRAM, and so on. The memory system 1010 may be configured, for example, as a solid state drive/disk (SSD) which uses a nonvolatile memory to store data. Also as an example, the memory system 1010 may be provided as a fusion flash memory for example, a NAND or a NOR flash memory.

It is not that the above-described embodiments are realized only by a device and a method, but they may be realized also by a program which performs a function corresponding to the configuration of each embodiment or a recording medium on which the program is recorded. Such realization may be easily derived from the descriptions of the above-described embodiments by a person skilled in the art to which the embodiments pertain.

Although various embodiments have been described for illustrative purposes, it will be apparent to those skilled in the art that various changes and modifications may be made without departing from the spirit and scope of the invention as defined in the following claims.

What is claimed is:

1. A semiconductor memory device comprising:

a memory cell array and a row decoder disposed in a first direction over a substrate; and a plurality of coupling lines for electrically coupling the memory cell array and the row decoder, wherein each of the coupling lines comprises:

a first conductive line disposed in the first direction;

a second conductive line disposed parallel to the first conductive line; and a pad coupling between the first conductive line and the second conductive line, and electrically coupled to the memory cell array or the row decoder through a contact plug, wherein the coupling lines are routed from both sides of the respective pads in the first direction, and wherein the pads of the coupling lines are disposed in a direction oblique to the first direction and a second direction perpendicular to the first direction.

2. The semiconductor memory device according to claim 1, wherein the first conductive line and the second conductive line extend in opposite directions from the pad.

3. The semiconductor memory device according to claim 1, wherein the coupling lines are disposed such that the respective pads do not overlap with pads of adjacent coupling lines in the second direction.

4. The semiconductor memory device according to claim 3, wherein the pad of each of the coupling lines overlaps with the first conductive line or the second conductive line of the adjacent coupling line in the second direction.

5. The semiconductor memory device according to claim 1, wherein the coupling lines include n (n is a natural number equal to or greater than 3) number of coupling lines which are disposed sequentially in the second direction, and wherein the second conductive line of a (k−1)th (k is a natural number equal to or greater than n−2) coupling line among the coupling lines is disposed on the same line as the first conductive line of a (k+1)th coupling line.

6. The semiconductor memory device according to claim 1, wherein the pad of each of the coupling lines comprises:

a quadrangular frame-shaped structural body coupled between the first conductive line and the second conductive line; and an internal line pattern disposed in the first direction, in an internal region surrounded by the quadrangular frame-shaped structural body.

7. The semiconductor memory device according to claim 6, wherein the quadrangular frame-shaped structural body comprises:

a first line pattern extending from an end of the first conductive line in the first direction, and having a width substantially the same as the first conductive line;

a second line pattern extending from an end of the second conductive line in the first direction, and having a width substantially the same as the second conductive line;

a third line pattern extending from an end of the first line pattern to the second line pattern in the second direction; and a fourth line pattern extending from an end of the second line pattern to the first line pattern in the second direction.

8. The semiconductor memory device according to claim 7, wherein a spacing between the first line pattern and the internal line pattern in the second direction and a spacing between the second line pattern and the internal line pattern in the second direction are the same as a spacing between the coupling lines.

9. The semiconductor memory device according to claim 1, wherein the pad has a rectangular structure.

10. The semiconductor memory device according to claim 1, wherein at least one of the first conductive line and the second conductive line extends from both sides of the pad, and the first conductive line and the second conductive line overlap at least partially in the second direction.

11. The semiconductor memory device according to claim 10, wherein each of the coupling lines further comprises a third conductive line which is disposed parallel to the first and second conductive lines between the first conductive line and the second conductive line which overlap in the second direction, and wherein a spacing between the first conductive line and the third conductive line in the second direction and a spacing between the second conductive line and the third conductive line in the second direction are the same as a spacing between the coupling lines.

12. A semiconductor memory device comprising:

a first sub memory cell array and a second sub memory cell array disposed adjacent to each other in a first direction;

a first sub row decoder disposed between the first sub memory cell array and the second sub memory cell array; and coupling lines disposed over the first and second sub memory cell arrays and the first sub row decoder, wherein each of the coupling lines comprises a first conductive line which is disposed in the first direction, a second conductive line which is disposed parallel to the first conductive line, and a pad which is coupled between the first conductive line and the second conductive line and is electrically coupled to the first sub row decoder through a first contact plug, and wherein each of the coupling lines is routed from both sides of the corresponding pad in the first direction and is electrically coupled to the first sub memory cell array and the second sub memory cell array.

13. The semiconductor memory device according to claim 12, wherein the first sub row decoder comprises:

a plurality of pass transistors having sources which are respectively coupled to the first contact plugs and drains which are respectively coupled to corresponding control gate lines.

14. The semiconductor memory device according to claim 12, wherein each of the first sub memory cell array and the second sub memory cell array comprises a plurality of gate lines which are stacked, and wherein each of the coupling lines is electrically coupled with one of some gate lines of the first sub memory cell array through a corresponding second contact plug, and is electrically coupled with one of some gate lines of the second sub memory cell array through a corresponding third contact plug.

15. The semiconductor memory device according to claim 14, further comprising:

a second sub row decoder disposed adjacent to the first sub row decoder in the first direction with the first sub memory cell array interposed therebetween, and electrically coupled with remaining gate lines of the first sub memory cell array; and a third sub row decoder disposed adjacent to the first sub row decoder in the first direction with the second sub memory cell array interposed therebetween, and electrically coupled with remaining gate lines of the second sub memory cell array.

16. A semiconductor memory device comprising:

a plurality of coupling lines each comprising a first conductive line which is disposed in a first direction, and a second conductive line which is disposed parallel to the first conductive line and a pad, wherein the pad of each of the coupling lines comprises:

a quadrangular frame-shaped structural body coupled between the first conductive line and the second conductive line; and an internal line pattern disposed in the first direction, in an internal region surrounded by the quadrangular frame-shaped structural body, and wherein the pads of the coupling lines are disposed in a direction oblique to the first direction and a second direction perpendicular to the first direction.

17. The semiconductor memory device according to claim 16, wherein the quadrangular frame-shaped structural body comprises:

a first line pattern extending from an end of the first conductive line in the first direction, and having a width substantially the same as the first conductive line;

a second line pattern extending from an end of the second conductive line in the first direction, and having a width substantially the same as the second conductive line;

a third line pattern extending from an end of the first line pattern to the second line pattern in the second direction; and a fourth line pattern extending from an end of the second line pattern to the first line pattern in the second direction.

18. The semiconductor memory device according to claim 17, wherein a spacing between the first line pattern and the internal line pattern in the second direction and a spacing between the second line pattern and the internal line pattern in the second direction are the same as a spacing between the coupling lines.

* * * * *